United States Patent
Duvvury et al.

(10) Patent No.: US 7,277,263 B2
(45) Date of Patent: Oct. 2, 2007

(54) LOCAL ESD PROTECTION FOR LOW-CAPACITANCE APPLICATIONS

(75) Inventors: Charvaka Duvvury, Plano, TX (US); Gianluca Boselli, Richardson, TX (US)

(73) Assignee: Texas Instruments Incorporated, Dallas, TX (US)

( * ) Notice: Subject to any disclaimer, the term of this patent is extended or adjusted under 35 U.S.C. 154(b) by 535 days.

(21) Appl. No.: 10/936,912

(22) Filed: Sep. 8, 2004

(65) Prior Publication Data
US 2006/0050453 A1  Mar. 9, 2006

(51) Int. Cl.
*H02H 9/00* (2006.01)
(52) U.S. Cl. .................................... 361/56
(58) Field of Classification Search ............ 361/56
See application file for complete search history.

(56) References Cited

U.S. PATENT DOCUMENTS

| | | | |
|---|---|---|---|
| 6,388,850 B1* | 5/2002 | Ker et al. ............. | 361/56 |
| 6,639,772 B2* | 10/2003 | Chuang et al. ........ | 361/56 |
| 6,690,557 B2* | 2/2004 | Hung et al. .......... | 361/56 |
| 2005/0045909 A1* | 3/2005 | Zhang .............. | 257/173 |
| 2005/0045955 A1* | 3/2005 | Kim et al. ............ | 257/355 |

* cited by examiner

*Primary Examiner*—Ronald W. Leja
(74) *Attorney, Agent, or Firm*—Rose Alyssa Keagy; W. James Brady; Frederick J. Telecky, Jr.

(57) ABSTRACT

A semiconductor device for locally protecting an integrated circuit input/output (I/O) pad (301) against ESD events, when the I/O pad is located between a power pad (303) and a ground potential pad (305*a*). A first diode (311) and a second diode (312) are connected in series, the anode (311*b*) of the series connected to the I/O pad and the cathode (312*a*) connected to the power pad. A third diode (304) has its anode (304*b*) tied to the ground pad and its cathode (304*a*) tied to the I/O pad. A string (320) of at least one diode has its anode (321*b*) connected to the series between the first and second diode (node 313), isolated from the I/O pad, and its cathode (323*a*) connected to the ground pad. The string (320) may comprise three or more diodes.

8 Claims, 6 Drawing Sheets

LOCAL ESD PROTECTION FOR LOW-CAPACITANCE APPLICATIONS

FIELD OF THE INVENTION

The present invention is related in general to the field of electronic systems and semiconductor devices and more specifically to the local ESD protection for low capacitance pads of high-speed integrated circuits.

DESCRIPTION OF THE RELATED ART

Integrated circuits (ICs) may be severely damaged by electrostatic discharge (ESD) events. A major source of ESD exposure to ICs is from the human body (described by the "Human Body Model", HBM); the discharge of the human body generates peak currents of several amperes to the IC for about 100 ns. A second source of ESD is from metallic objects (described by the Machine model", MM); it can generate transients with significantly higher rise times and current levels than the HBM ESD source. A third source is described by the "charged device model" (CDM), in which the IC itself becomes charged and discharges to ground in rise times less than 500 ps.

ESD phenomena in ICs are growing in importance as the demand for higher operating speed, smaller operating voltages, higher packing density and reduced cost drives a reduction of all device dimensions. This generally implies thinner dielectric layers, higher doping levels with more abrupt doping transitions, and higher electric fields—all factors that contribute to an increased sensitivity to damaging ESD events.

The most common protection schemes used in metal-oxide-semiconductor (MOS) ICs rely on the parasitic bipolar transistor associated with an nMOS device whose drain is connected to the pin to be protected and whose source is tied to ground. The protection level or failure threshold can be set by varying the nMOS device width from the drain to the source under the gate oxide of the nMOS device. Under stress conditions, the dominant current conduction path between the protected pin and ground involves the parasitic bipolar transistor of that nMOS device. This parasitic bipolar transistor operates in the snapback region under pin positive with respect to ground stress events.

The dominant failure mechanism, found in the nMOS protection device operating as a parasitic bipolar transistor in snapback conditions, is the onset of second breakdown. Second breakdown is a phenomenon that induces thermal runaway in the device wherever the reduction of the impact ionization current is offset by the thermal generation of carriers. Second breakdown is initiated in a device under stress as a result of self-heating. The peak nMOS device temperature, at which second breakdown is initiated, is known to increase with the stress current level.

Figures 1, 2A:
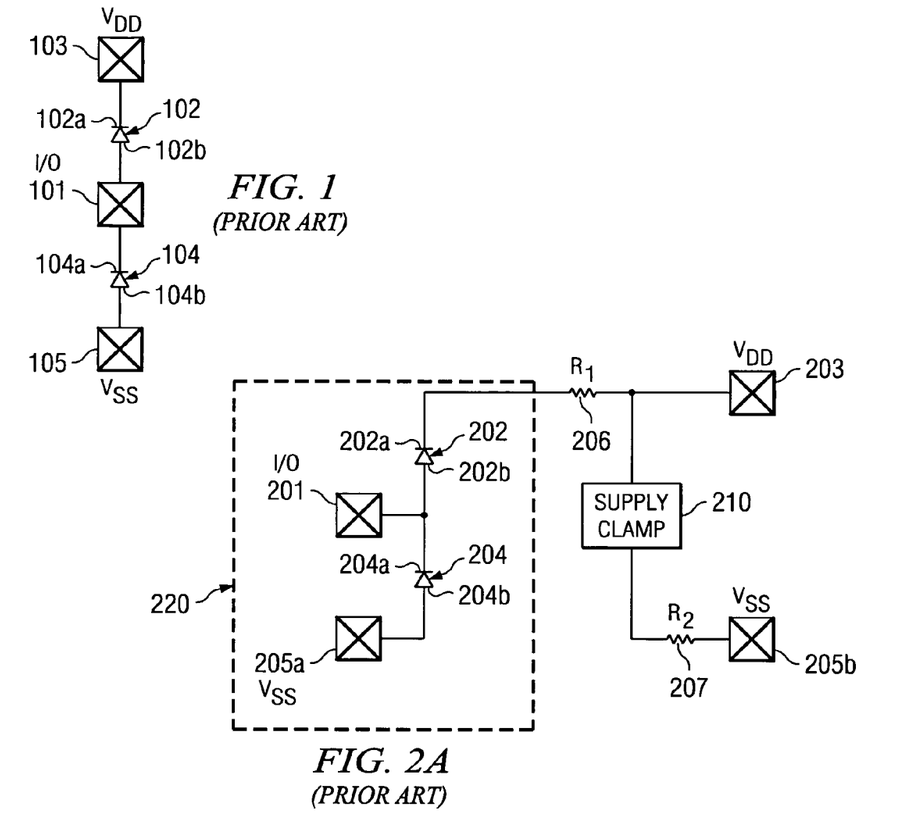
FIG. 1 is a schematic circuit diagram of the ESD protection of an integrated circuit input/output (I/O) pad in known technology.
FIG. 2A is a schematic circuit diagram of the ESD protection for low-capacitance requirements using dual diodes at the I/O (signal) pad in known technology.

The conventional ESD protection approach for an input/output pad 101 in known technology is illustrated in the schematic circuit diagram of FIG. 1. A pn-diode 102 has its cathode 102a connected to power pad 103 (Vdd) for positive ESD stress, and its anode 102b connected to input/output (I/O) pad 101. Another pn-diode 104 has its anode 104b connected to ground potential 105 (Vss) for negative ESD stress, and its cathode 104a to I/O pad 101. The disadvantage of this approach is that the on-resistance of diode 102 determines the effectiveness of this protection. Consequently, diode 102 has to be made large, which contradicts the general drive to miniaturize all components and is especially unsatisfactory for high speed circuits requiring small area and low capacitance diodes. When sufficient voltage builds up, diode 104 goes into reverse breakdown and fails; diode 102, thus, has to be large to handle all positive stress current. Furthermore, diode 104 with its high breakdown may not protect the output nMOS transistor that may have a lower breakdown.

SUMMARY OF THE INVENTION

A need has therefore arisen for cost effective design methods to achieve advanced ESD protection, compatible with uniform turn-on, high response speed, low capacitance and low leakage current using standard CMOS processing. An emphasis is to be placed to protect pads locally, and to achieve this protection by using the silicon area needed for the pads in dual ways. It is a technical advantage that the device structures provide excellent electrical performance, mechanical stability and high reliability. It is further a technical advantage that the fabrication method is simple, yet flexible enough for different semiconductor product families and a wide spectrum of design and process variations.

One embodiment of the invention is a semiconductor device for locally protecting an integrated circuit input/output (I/O) pad against ESD events, when the I/O pad is located between a power pad and a ground potential pad. A first diode and a second diode are connected in series, the anode of the series connected to the I/O pad and the cathode connected to the power pad. A third diode has its anode connected to the ground pad and its cathode connected to the I/O pad. A string of at least one diode has its anode connected to the series between the first and second diode, isolated from the I/O pad, and its cathode connected to the ground pad. The string may comprise two, three or more diodes.

It is a technical advantage that the local protection device is positioned under the I/O pad, fitting into its geometrical area. Further, the capacitance of the local protection device is screened from the I/O pad, rendering the local protection device suitable for low-capacitance signal cells.

It is another technical advantage that the local ESD protection does not rely on the supply clamp, which couples the power pad resistively to ground. Consequently, the effectiveness of the local protection is practically independent from the bus resistance of the power pad.

Another embodiment of the invention is a semiconductor device for locally protecting an I/O pad between power and ground against ESD events, comprising a first and second diode connected in series so that the anode of the first diode is connected to the I/O pad and the cathode of the second diode is connected to power. A third diode has its anode connected to ground and its cathode to the I/O pad. An MOS transistor has its source connected to ground, its gate connected to ground, and its drain connected to the series between the first and the second diode, isolated from the I/O pad. This transistor is positioned in close proximity and alignment with the second diode so that a localized parasitic silicon-controlled rectifier is formed, which is operable to distribute an ESD current. The MOS transistor may be a multi-finger transistor, but in any event the local protection device is positioned under the I/O pad, fitting into its geometrical area.

It is a technical advantage that the local SCR-based protection device fits into the geometrical area under the I/O pad; the capacitance of the local protection device is thus screened from the I/O pad, making the local protection device suitable for low-capacitance signal cells.

Additional technical advantages of the invention are that the embodiments are easy to manufacture and that they are robust against latch-up during normal operation.

The technical advances represented by the invention, as well as the aspects thereof, will become apparent from the following description of the preferred embodiments of the invention, when considered in conjunction with the accompanying drawings and the novel features set forth in the appended claims.

DETAILED DESCRIPTION OF THE PREFERRED EMBODIMENTS

The present invention is related to U.S. patent application Ser. No. 10/698,633, filed Oct. 31, 2003 (Salling et al., "Efficient ESD Protection with Application for Low Capacitance I/O Pads").

The impact of the present invention can be most easily appreciated by highlighting the shortcomings of the known approaches to provide protection against ESD events on input/output (I/O) pads of integrated circuits (IC) with ultra-low capacitance (<100 fF) requirements for very high speed operations. Compared to the ESD protection shown in FIG. 1, with diode 102 effective for positive stress and diode 104 for negative stress, an approach in known technology for improved protection device efficiency is presented in the schematic circuit diagram of FIG. 2A. 201 designates the I/O pad to be protected. For positive ESD stress, diode 202 is effective, which has its anode 202b connected to I/O pad 201, and its cathode 202a connected through bus layout resistance 206 (first portion $R_1$ of bus resistance) to power terminal 203 (Vdd). For negative ESD stress, diode 204 (with anode connected to ground 205a and cathode connected to I/O pad 201) offers protection. Power pad 203 has a supply clamp 210 as ESD protection to ground (205b, Vss) through resistance 207 (second portion $R_2$ of bus resistance).

Figure 2B:
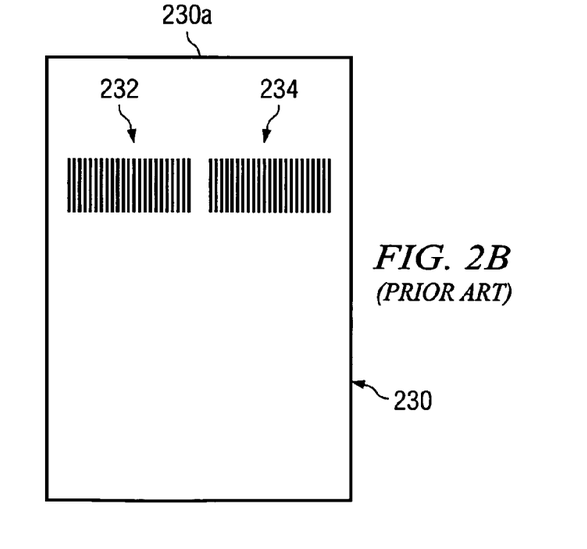
FIG. 2B is a top view displaying schematically the utilization of the I/O pad area by the dual diode ESD protection in known technology.

Dashed outline 220 schematically marks the components and functions, which can be geometrically accommodated in the area allocated for I/O pad 201. The top view of FIG. 2B is a simplified, approximate reproduction of the area 230 consumed for pad 201. The area has rectangular shape bordered by outline 230a. As can be seen, the area 232 needed for diode 202, and the area 234 needed for diode 204 consume only a fraction of the pad area 230 and thus fit easily inside area 230, with much area to spare. Normally, for standard I/O applications, where capacitance is not an issue, the available area 230 is filled with diodes 202 and 204.

In many IC devices, the substrate is p-type; consequently, diode 202 is built in an n-well and is a pn-diode. Diode 204 can be built in a separate n-well, but may also be built in the substrate. In order to meet the capacitance required for very high speed applications, the diodes have to be made accordingly small. For many applications, however, this requirement is in conflict with the intent of using large-area diodes, since the ESD performance is proportional to the active area. Furthermore, by using the dual-diode approach of FIG. 2A, the ESD energy is discharged through the supply clamp 210, which, in turn, places restrictions on the maximum allowed value of the bus resistance $R=R_1+R_2$. As an example, when $R_1+R_2$ becomes too large, the voltage drop across the resistors builds up the potential at pad 201 leading to failure of the reverse diode 204. Consequently, diode area, capacitance, $R_1+R_2$ bus layout resistance restriction, all of these make the ESD optimization a complex process.

Figure 3A:
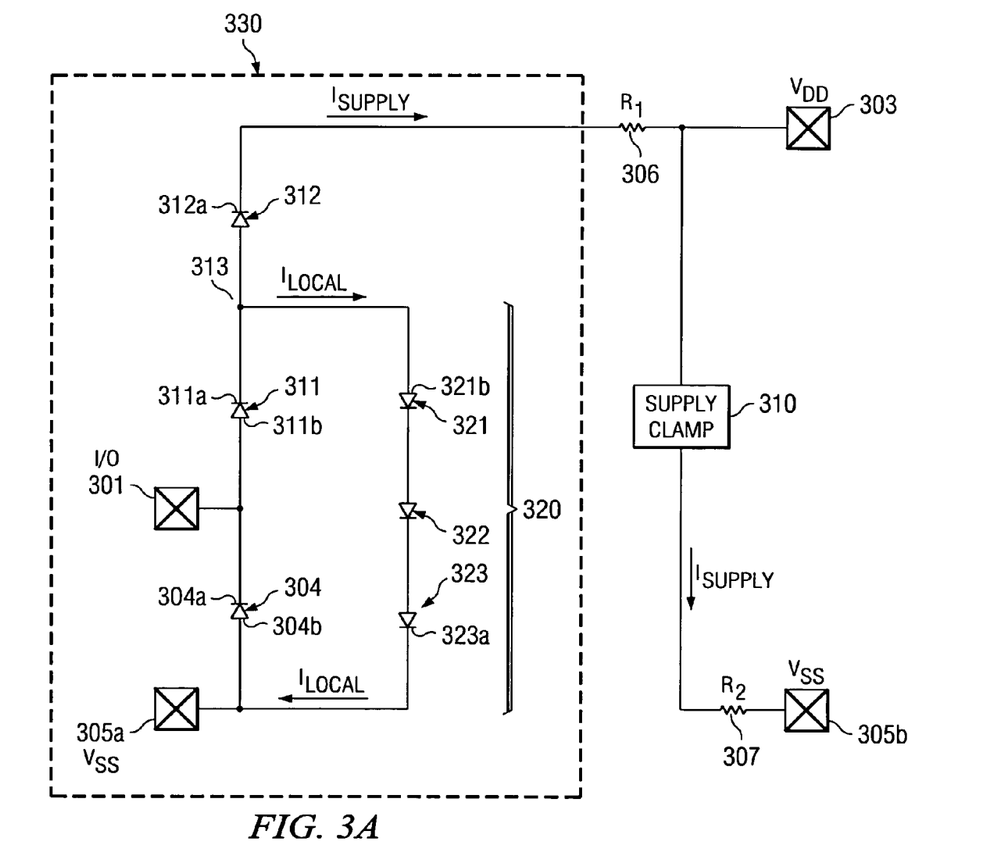
FIG. 3A is a schematic circuit diagram of an embodiment of the invention for ESD protection of low-capacitance I/O pads, showing the formation of a local ESD clamp by a string of diodes.

FIG. 3A displays a schematic circuit diagram of an embodiment of the present invention to provide local ESD protection for a cell with ultra-low capacitance (<100 fF) requirements in very high speed operations. 301 designates the I/O pad to be protected against ESD events. As defined herein, "local" implies the geometrical area consumed by the I/O pad-to-be-protected. A local ESD protection device is thus a device whose components can be geometrically accommodated under the pad in the area consumed by the pad-to-be-protected. The outline of this area is indicated by the dashed line 330 in FIG. 3A.

I/O pad 301 is located between power pad 303 (Vdd) and ground potential pad 305a (Vss). The embodiment comprises first diode 311 and second diode 312 connected in series. Diode 311 is a low capacitance diode with respect to Vdd. The anode 311b of the series (which is the anode of the first diode 311) is tied to I/O pad 301, and the cathode 312a of the series (which is the cathode of the second diode 312) is tied to power pad 303. Resistance 306 (first portion $R_1$ of bus resistance) is a parasitic resistance of the metal lead between cathode 312 and Vdd pad 303. A third diode 304 has its anode 304b connected to ground pad Vss 305a and its cathode 304a connected to I/O pad 301. Diode 304 is a low capacitance diode with respect to Vss.

The embodiment further comprises a string 320 of diodes in series. The string may comprise at least one diode 321; in other embodiments for larger I/O voltage, like the one shown in FIG. 3A, there may be three diodes 321, 322, and 323 in series; for yet higher I/O voltages, there are embodiments having five or any other number of diodes in series. The anode 321b of the string is tied to the series of first diode 311 and second diode 312 between the first and second diode, isolated from the I/O pad 301. The capacitance of string 320 is thus screened from I/O pad 301. Further, floating node 313 at the cathode 311a of diode 311 renders the I/O pad protection largely independent of the supply clamp 310 at the Vdd pad 303. The cathode 323a of string 320 is tied to ground pad 305a.

Power pad 303 has a supply clamp 310 as ESD protection to ground (305b, Vss) through resistance 307 (second portion $R_2$ of bus resistance). The local ESD clamp with string 320 does not rely on the supply clamp 310; as a matter of fact, approximately 70 to 85% of an ESD energy is discharged through the local clamp to ground, while only approximately 15 to 30% of the ESD energy is discharged through supply clamp 310 to ground. The effectiveness of the local clamp is thus practically independent of the bus resistance $R=R_1+R_2$.

Figure 4:
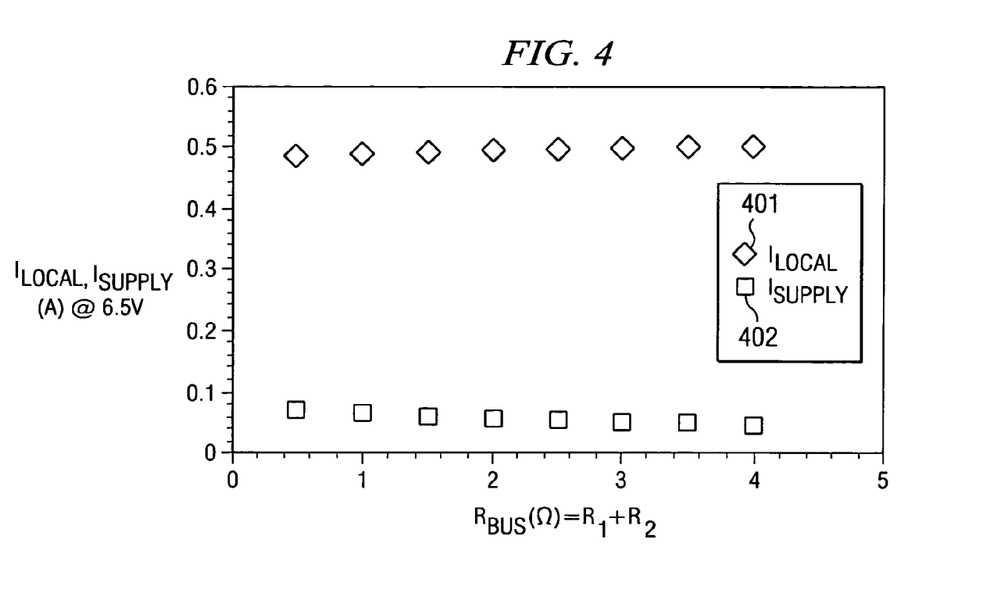
FIG. 4 plots simulation data of the currents in the local clamp and the supply clamp as a function of the bus resistance.

Quantitative SPICE simulation data of the effect of the local string of diodes are displayed in FIG. 4. For example, a criterion was established that defines as an ESD failure when the pad voltage reaches 6.5 V. This condition is determined by the total current ($I_{local}+I_{supply}$). (The current portions $I_{local}$ and $I_{supply}$ are indicated in FIG. 3.) This criterion is expressed in general terms and may change for different technologies. Plotted in FIG. 4 are the ESD current (401) discharged through the local string of diodes, $I_{local}$, and the ESD current (402) discharged through the supply clamp, $I_{supply}$, both measured in ampere at 6.5 volt, as a function of the bus resistance $R_{bus}=R_1+R_2$, measured in ohm. The data indicate that in the embodiment of FIG. 3A, the supply clamp does not play a significant role, only the local clamp of diodes does; however, the number of Vdd clamps in the design exerts an influence.

Figure 6:
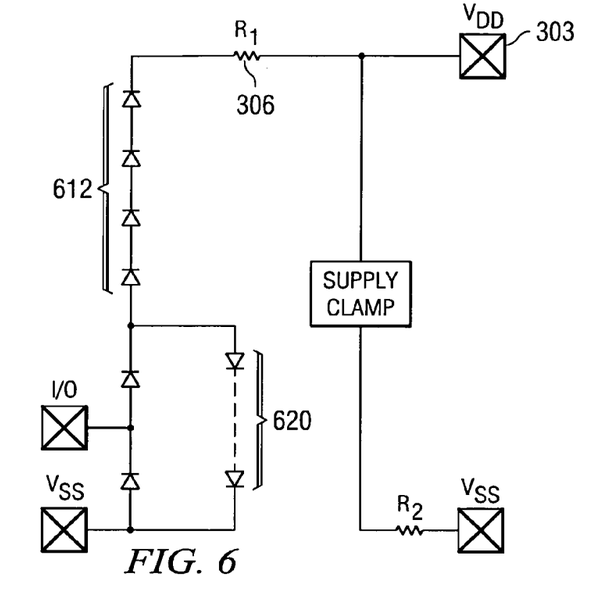
FIG. 6 is a schematic circuit diagram of another embodiment of the invention for ESD protection of low-capacitance I/O pads, showing the formation of a local ESD clamp by a string of diodes.

In summary, the embodiment of the invention as exemplified by diodes 311, 312, and the string 320 in FIG. 3A and verified in FIG. 4 eliminates certain limitations of the known technology: The voltage transitions of the input I/O are no longer limited to a single diode voltage drop to Vdd (an embodiment achieving an even larger voltage drop is illustrated in FIG. 6). Using the advantage of the embodiment of FIG. 3A, the diode size (311 and 304) may remain in the range of ultra-low capacitance and does no longer have to be large to handle the desired ESD level. The Vdd bus resistance (306) is no longer the limit to the ESD level, which the protection can handle.

Figure 3B:
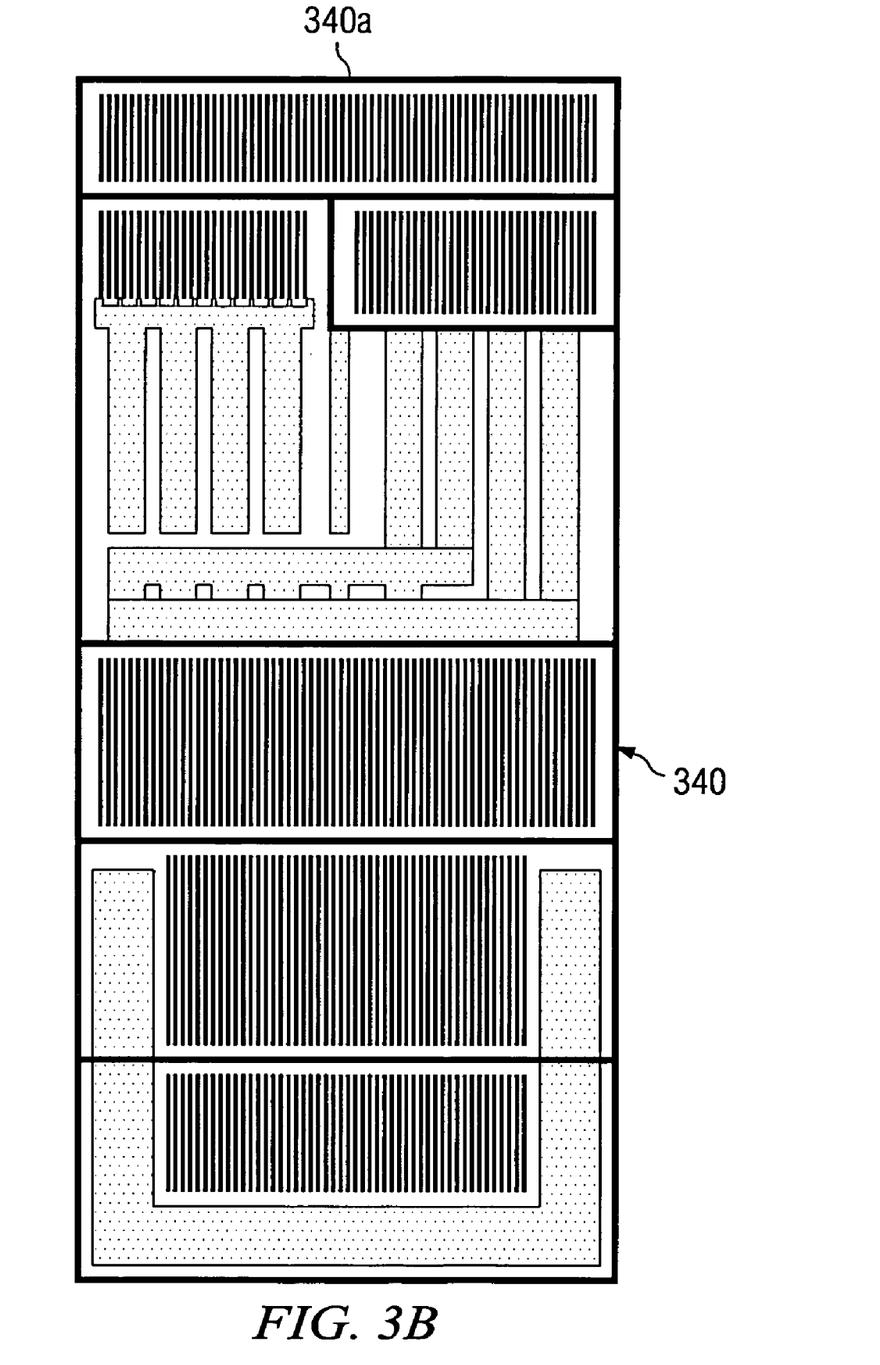
FIG. 3B is a top view displaying schematically the utilization of the I/O pad area by the local ESD protection according to an embodiment of the invention.

Dashed outline 330 in FIG. 3A marks schematically the components and functions, which can be geometrically accommodated in the area needed for I/O pad 301. The top view of FIG. 3B is a simplified, approximate reproduction of the area 340 consumed for pad 301. The area has rectangular shape bordered by outline 340a. The individual areas needed to accommodate diode components 311, 312, 304, and 320 of the example displayed in FIG. 3A are shaded. As can be seen in FIG. 3B, the areas needed for the components of the example fit readily into the available area and use it to good advantage, but do not even consume the total area available. Consequently, the concept of the embodiment of FIG. 3A has universal I/O ESD applications.

Figure 5:
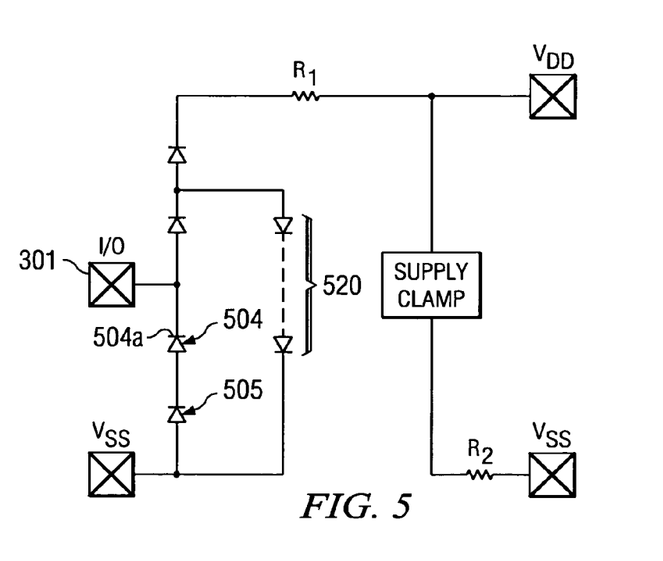
FIG. 5 is a schematic circuit diagram of another embodiment of the invention for ESD protection of low-capacitance I/O pads, showing the formation of a local ESD clamp by a string of diodes.

Other embodiments, which utilize the available local I/O pad area, are depicted in FIGS. 5 and 6. FIG. 5 shows a series of diodes 504 and 505, rather than the single diode 304 in FIG. 3A. The cathode 504a of the series is tied to I/O pad 301. The embodiment provides noise suppression under negative ground bounce. According to the invention, the local protection device 520 includes a string of more than one diode.

FIG. 6 shows, as an example, a string 612 of four diodes selected to lower the 5.0 V at the I/O pad to 3.3 V at the bus resistance 306 to Vdd (303). This embodiment of using a string of diodes instead of the single diode 312 in FIG. 3A for reducing the voltage seen at I/O to the voltage desired at Vdd, can be modified to a wide range of desired voltage reductions; according to the invention, there is enough area locally available under the I/O pad (see FIG. 3B) for placing the extra diodes. The local protection device 620 includes a string of more than one diode.

Figure 7:
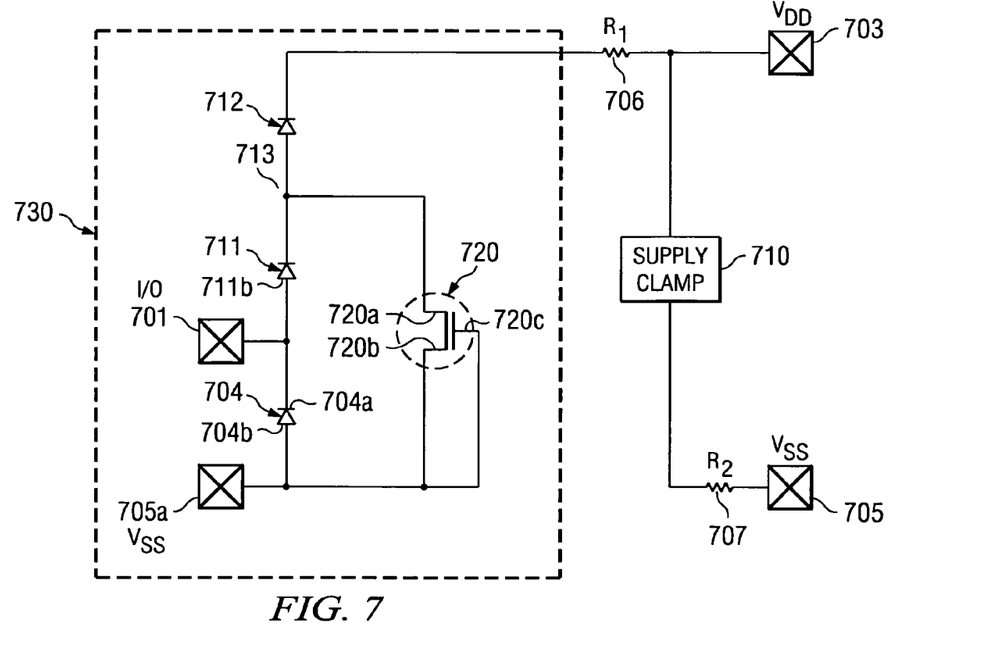
FIG. 7 is a schematic circuit diagram of another embodiment of the invention for ESD protection of low-capacitance I/O pads, comprising a local MOS transistor in proximity with a local diode.

Another embodiment of the invention, displayed in the schematic circuit diagram of FIG. 7, is a semiconductor device for locally protecting an integrated circuit I/O pad 701 against ESD events involving the combination with an MOS transistor. I/O pad 701 is located between Vdd power pad 703 and Vss ground potential pad 705a. A first diode 711 and a second diode 712 are connected in series; the anode 711b of the first diode 711 is connected to pad 701 and the cathode of the second diode is connected through resistor 706 to power pad 703. Diode 711 is a low capacitance diode with respect to Vdd. A third diode 704 is connected with its anode 704b to ground pad 705a and with its cathode 704a to I/O pad 701. Diode 704 is a low capacitance diode with respect to Vss.

A local MOS transistor 720 has its source 720b connected to ground pad (Vss) 705a, its gate 720c also connected to ground pad (Vss) 705a, and its drain 720a connected to node 713 in the series connection between first diode 711 and second diode 712. By connecting the transistor within the diode series, it is isolated from the I/O pad 701. Transistor 720 is positioned geometrically in close proximity and alignment with the second diode 712 so that a localized parasitic silicon-controlled rectifier is formed, which is operable to distribute an ESD current.

Dashed outline 730 in FIG. 7 marks schematically the components and functions, which can be geometrically accommodated in the area needed for I/O pad 701, creating the local ESD clamp.

Power pad 703 has a supply clamp 710 as ESD protection to ground (705b, Vss) through resistance 707 (second portion $R_2$ of bus resistance). The local ESD clamp with transistor 720 does not rely on the supply clamp 710. As a matter of fact, approximately 70 to 85% of an ESD energy is discharged through the local clamp to ground, while only approximately 15 to 30% of the ESD energy is discharged through supply clamp 710 to ground. The effectiveness of the local clamp is thus independent of the bus resistance $R=R_1+R_2$.

Figures 8, 9:
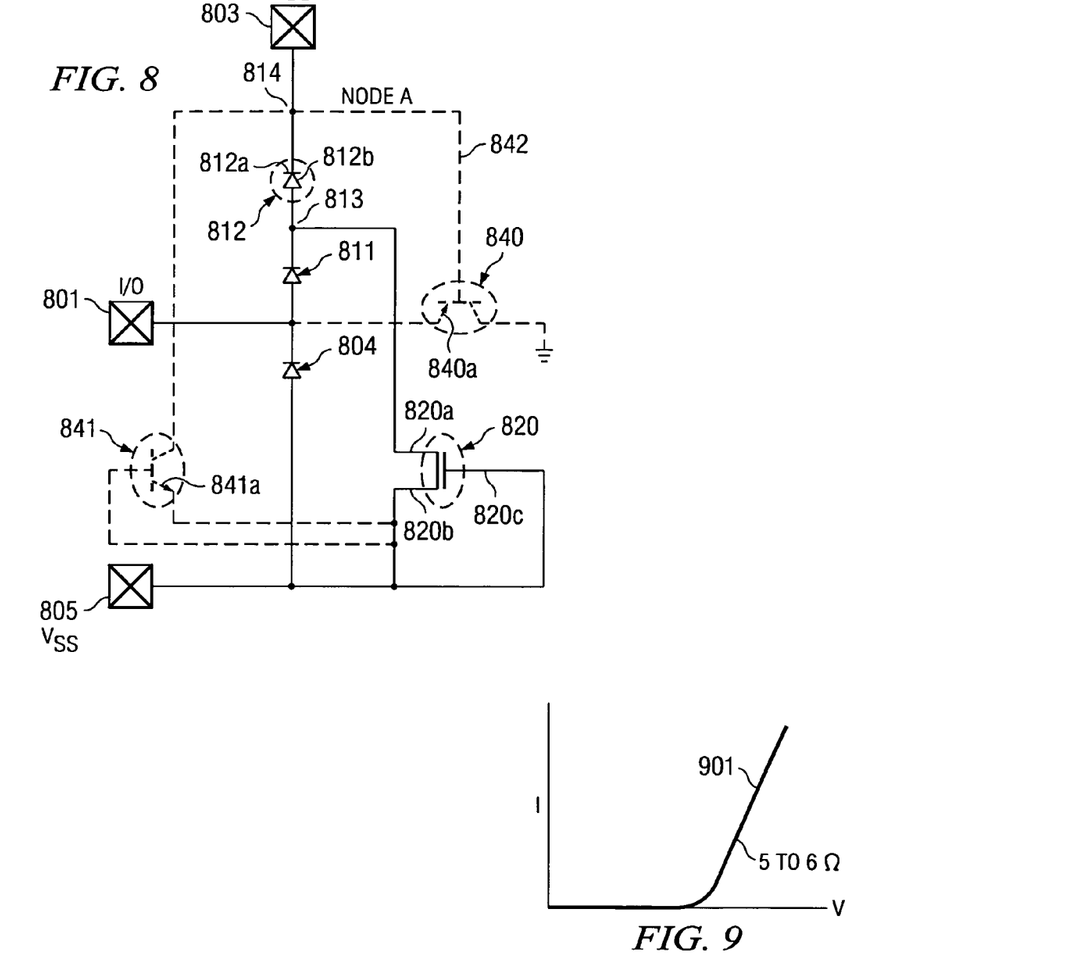
FIG. 8 is a portion of the schematic circuit diagram of FIG. 7 showing the formation of a parasitic silicon controlled rectifier by a local MOS transistor in proximity with a local diode.
FIG. 9 shows the current-voltage characteristic of a typical nMOS transistor.

FIG. 8 is a modified, and simplified, version of FIG. 7 in order to depict the formation and function of the silicon-controlled rectifier in more detail. The MOS transistor 820 is built in a substrate of first conductivity type. For many products, the first conductivity type is p-type and the MOS transistor is an nMOS transistor; in this case, the opposite conductivity type is n-type, the diode is a pn-diode, and the silicon controlled rectifier a pnpn-SCR.

A first diode 811 and a second diode 812 are connected in series, each diode in its own well of the opposite conductivity type in the substrate of the first conductivity type. The anode of first diode 811 is connected to I/O pad 801, and the cathode of second diode 812 is tied to power pad 803. A third diode 804 in the substrate is with its anode connected to ground pad 805 and its cathode to I/O pad 801.

MOS transistor 820, built as a multi-finger transistor in the substrate, is in close proximity to the well of second diode 812. The proximity comprises a distance selected for SCR effectiveness in conjunction with the substrate resistivity. As an example, for substrate sheet resistances in the range from about 200 to 500 $\Omega/\square$, the proximity comprises a distance of less than 5 µm. MOS transistor 820 comprises a source region 820b, connected to ground pad 805, a gate region 820c, also tied to ground pad 805, and a drain region 820a, connected to node 813 in the series between first diode 811 and said second diode 812. By connecting the transistor within the diode series, it is isolated from I/O pad 801.

The second diode 812 is built as an interdigitated diode. It has a plurality of anode regions of the first conductivity type, which are connected to the cathode of the first diode 811 and to the drain 820a, and a plurality of cathode regions of said opposite conductivity type, which are connected to power pad 803. Each region of transistor 820 is aligned with a corresponding region of the second diode 812 such that the diode-anode regions are positioned at a close proximity to the source regions, and the diode-cathode regions are positioned at close proximity to the drain regions.

Each of the transistor and second diode regions, respectively, coupled by this proximity and those connections, is creating a localized parasitic silicon-controlled rectifier (SCR). The parasitic SCR comprises an SCR-anode 840a formed by the diode-anode 812b; a first base region formed by the well of the second diode; a second base region formed by the substrate; and an SCR-cathode 841a formed by the transistor source 820b.

In FIG. 8, the parasitic SCR is indicated by its pnp transistor portion 840 and its npn transistor portion 841, interconnected by dashed line 842. In this parasitic SCR, the node A, designated as 814, is the same as power terminal 803 (Vdd). The I/O pad 801 becomes the SCR-anode, and ground potential 805 (Vss) becomes the SCR-cathode.

The parasitic SCR offers efficient ESD protection because it is operable to distribute an ESD current at low voltages. In the embodiment of FIG. 8, no guard ring is placed between diode 812 and transistor 840 to trigger the SCR, some embodiments, however, may use a guard ring. A further layout advantage of the embodiment of FIG. 8 is the fact that the gate 820c of MOS transistor 820 does not need a resistor to ground potential 805, since the successful ESD protection of FIG. 8 does not depend on an efficient npn device (which is essential in the prior art).

Figure 10:
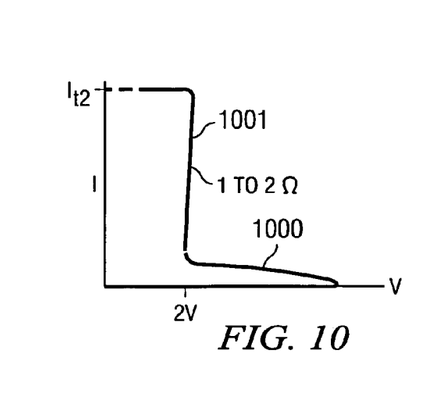
FIG. 10 shows the current-voltage characteristic of a component SCR.
Figure 11:
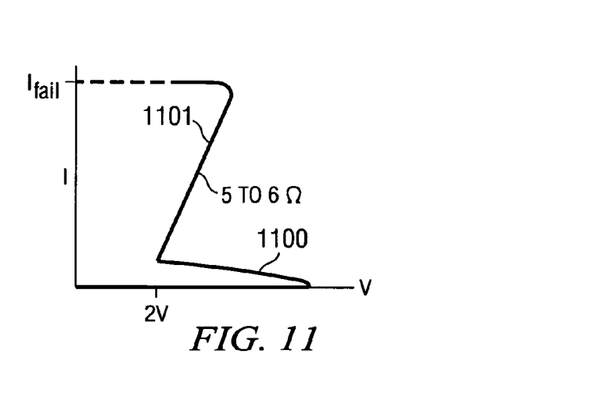
FIG. 11 shows the current-voltage characteristic of the parasitic SCR of the invention as a combination of the characteristics of FIGS. 9 and 10.

The current-voltage characteristic of the parasitic SCR can, in principle, be construed by combining the I-V characteristic of an nMOS transistor (FIG. 9, about 5 to 6 $\Omega$ on-resistance slope in curve portion 901) with the I-V characteristic of a component SCR (FIG. 10, curve 1000, about 1 to 2 $\Omega$ on-resistance slope in curve portion 1001). FIG. 11 depicts schematically the I-V characteristic of the parasitic SCR (curve 1100, on-resistance slope of 5 to 6 $\Omega$ in curve portion 1101).

While this invention has been described in reference to illustrative embodiments, this description is not intended to be construed in a limiting sense. Various modifications and combinations of the illustrative embodiments, as well as other embodiments of the invention, will be apparent to persons skilled in the art upon reference to the description. As an example, the embodiments are effective in pMOS transistors as well as in nMOS transistors to create ESD protection. As another example, the substrate material may include silicon, silicon germanium, gallium arsenide and other semiconductor materials employed in manufacturing. As yet another example, the concept of the invention is effective for many semiconductor device technology nodes and not restricted to a particular one. It is therefore intended that the appended claims encompass any such modifications or embodiments.

We claim:

1. A semiconductor device for locally protecting an integrated circuit input/output (I/O) pad against ESD events, said I/O pad located between a power pad and a ground potential pad, comprising:
    a first diode and a second diode connected in series, the anode of said series connected to said I/O pad and the cathode connected to said power pad;
    a third diode having its anode connected to said ground pad and its cathode connected to said I/O pad; and
    a string of at least one diode, the anode of said string connected to said series between said first and said second diode, isolated from said I/O pad, and the cathode of said string connected to said ground pad.

2. The device according to claim 1 wherein the local protection device, including said first, second, third and string of diodes, is positioned under said I/O pad and geometrically fits into the area consumed by said I/O pad.

3. The device according to claim 1 further comprising an additional ESD protection device for said power pad, said power pad protection operable to discharge direct ESD current to ground potential.

4. The device according to claim 3 wherein said power pad protection discharges to ground potential between about 15 and 30% of an ESD current, while said string of at least one diode protects said I/O pad locally against ESD events by discharging to ground potential between about 70 to 85% of the ESD current.

5. The device according to claim 1 wherein said string of diodes comprises three diodes.

6. The device according to claim 1 wherein said string of diodes comprises five diodes.

7. The device according to claim 1 wherein said second diode comprises a series of more than one diode, the cathode of said series connected to said power pad.

8. The device according to claim 1 wherein said third diode comprises a series of more than one diode, the cathode of said series connected to said I/O pad.

* * * * *